United States Patent
Takenaka

(10) Patent No.: US 7,362,628 B2
(45) Date of Patent: Apr. 22, 2008

(54) SEMICONDUCTOR MEMORY AND REDUNDANCY REPAIR METHOD

(75) Inventor: Tetsuro Takenaka, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/074,684

(22) Filed: Mar. 9, 2005

(65) Prior Publication Data

US 2005/0207244 A1 Sep. 22, 2005

(30) Foreign Application Priority Data

Mar. 18, 2004 (JP) ............................. 2004-077872

(51) Int. Cl.
*G11C 7/00* (2006.01)
*G11C 29/00* (2006.01)

(52) U.S. Cl. .................................. 365/200; 365/225.7

(58) Field of Classification Search ................ 365/200, 365/185.09
See application file for complete search history.

(56) References Cited

U.S. PATENT DOCUMENTS

| | | | | | |
|---|---|---|---|---|---|
| 5,179,536 | A | * | 1/1993 | Kasa et al. | 365/200 |
| 5,281,868 | A | * | 1/1994 | Morgan | 326/10 |
| 5,379,259 | A | * | 1/1995 | Fujita | 365/200 |
| 5,673,227 | A | * | 9/1997 | Engles et al. | 365/200 |
| 6,134,142 | A | * | 10/2000 | Hirano | 365/185.09 |
| 6,853,596 | B2 | * | 2/2005 | Cheung | 365/200 |
| 7,142,471 | B2 | * | 11/2006 | Fasoli et al. | 365/200 |

FOREIGN PATENT DOCUMENTS

JP   11-273392   10/1999

* cited by examiner

*Primary Examiner*—Amir Zarabian
*Assistant Examiner*—Michael Weinberg
(74) *Attorney, Agent, or Firm*—Donald R. Studebaker; Nixon Peabody LLP

(57) ABSTRACT

In a semiconductor memory in which redundancy repair is carried out on a block basis, when a defective block of memory cells is replaced by a first redundant block, the adjacent normal block of memory cells closest to the defect, or a part of that normal block, is also replaced by memory cells in a second redundant block. This repair strategy provides a simple way to isolate a defective memory cell so that the defect does not affect non-replaced memory cells.

12 Claims, 9 Drawing Sheets

PRIOR ART

PRIOR ART

PRIOR ART

SEMICONDUCTOR MEMORY AND REDUNDANCY REPAIR METHOD

BACKGROUND OF THE INVENTION

1. Field of the Invention

The present invention relates to redundancy repair in a semiconductor memory such as a programmable read-only memory (PROM), more particularly to block-wise redundancy repair.

2. Description of the Related Art

Each memory cell (hereinafter, cell) in a PROM typically consists of a single transistor with a floating gate. The memory cell is programmed by injecting charge into or removing charge from the floating gate, thereby altering the threshold value of the transistor. It is known art to provide a PROM with redundant memory cells that can be used to replace defective memory cells, thereby raising the yield of the PROM manufacturing process by enabling defective PROMs to be repaired. In one known redundancy repair scheme, an entire block of memory cells, including the defective memory cell, is replaced with a redundant block of memory cells. One advantage of this scheme is that it reduces the size of the circuitry that generates address signals to select the redundant memory cells.

FIG. 8 shows the general structure of a conventional PROM of this type, having a normal cell array 1 and a redundant cell array 2A. FIG. 9 shows the circuit structure of these cell arrays. The circuit structures of the cell drain selection circuit 3, column decoder circuit 4, defective cell block column redundancy selection circuit 5, and row decoder circuit 8 in FIG. 8 are shown in FIGS. 3, 4, 5, and 7, respectively.

The normal cell array 1 in FIG. 9 is divided into a plurality of blocks. Cell block 10, for example, includes a pair of bit lines BL2, BL3 and the memory cells ML2, MR2, ML3, MR3, etc. connected thereto. The redundant cell array 2A has a single redundant cell block 20 with a similar structure, including a pair of redundant bit lines RBL0, RBL1 and a plurality of redundant cells RML0, RMR0, RML1, RMR1, etc. The columns of cells in the normal cell array 1 are selected by four address signals AY0, AY1, AY2, AY3, of which AY2 and AY3 distinguish between different cell blocks.

In redundancy repair, if the circled cell ML2 in FIG. 9 is defective, for example, the entire cell block 10 including the defective cell is replaced with the redundant cell block 20 in the following procedure.

From FIGS. 4 and 9, it can be seen that cell block 10 is selected when column address signal AY2 is high and column address signal AY3 is low. In the defective cell block column redundancy selection circuit 5 in FIG. 5, fuse F50 in fuse-programmable circuit 50 is cut, setting a redundancy enable signal FMAIN to the high logic level. A similar fuse is cut in fuse-programmable circuit 51, setting a fuse-programmable address signal FY2 to the high logic level, while the fuse in fuse-programmable circuit 52 is left uncut, setting a fuse-programmable address signal FY3 to the low logic level. As a result, when column address signal AY2 is high and column address signal AY3 is low, the defective cell block column redundancy selection circuit 5 outputs a signal that selects redundant bit line RMBL0 or RMBL1, depending on the value of address signal AY1, and redundant data RDATA are read from the redundant cell block 20 and amplified by a redundant sense amplifier.

FIG. 10 shows an example of a type of defect that may occur. The source terminal of memory cell transistor ML2 is shorted to ground through a certain resistance, so that bit line BL2 is pulled down to the ground level. This problem affects all of the memory cells connected to bit line BL2.

Moreover, if memory cell transistor ML2 is programmed to the low-threshold state so that it turns on when word line select signal WL1 is active, adjacent memory cell MR1 is also affected. More specifically, if memory cell transistor MR1 is also programmed to the low threshold state, then when memory cell MR1 is read, the current iMC that should flow through transistor MR1 is diminished by the current iL leaking through memory cell ML2, so bit line BL1 receives only the difference current (iMR1=iMC−iL). The reduced current reduces the operating margin of the memory with respect to voltage and temperature variations, and if the defect at memory cell ML2 worsens over time, memory cell MR1 may become unreadable.

On the other side of cell block 10, if bit line BL3 or the source terminal of transistor MR3 leaks current to ground, similar problems will occur when memory cell ML4 is read.

Accordingly, when defective block 10 is replaced by redundant block 20, it would be convenient if adjacent half-block 11 or 12, comprising bit line BL1 or BL4 and its connected memory cells, could also be replaced, but a conventional memory designed for block-by-block redundancy repair does not permit the replacement of half-blocks, and in any case conventional block redundancy repair schemes do not contemplate the replacement of non-defective blocks or half-blocks.

Japanese Patent Application Publication No. H11-273392 (in particular FIGS. 1-3) discloses a PROM in which, when a bit line is defective, the memory cells connected to the bit line are programmed to the high-threshold state to prevent the defect from affecting other memory cells, and the memory cells thus programmed are replaced by redundant cells. This scheme, however, requires memory cells to be replaced on a bit-line basis rather than a block basis, making the circuit that controls the replacement and the circuit that reads data from the redundant memory cells more complex than when redundancy repair is performed block-wise. In particular, it is necessary to store the addresses of individual defective bit lines. The programming process also becomes more complex because it is necessary to program both the redundant memory cells and the memory cells they replace.

SUMMARY OF THE INVENTION

An object of the present invention is to provide a semiconductor memory in which redundancy repair can be carried out in a way that prevents defective memory cells from affecting non-replaced normal memory cells, without the need to program the defective memory cells or to store the addresses of individual lines of memory cells.

In the invented semiconductor memory, a cell block having a defective memory cell is replaced by a first redundant cell block, and a normal cell block adjacent to the defective cell block is replaced by a second redundant cell block. The normal cell block that is replaced is the normal cell block closest to the defective cell in the defective cell block. The defect in the defective cell block is thereby isolated so that it does not directly affect memory cells in blocks that have not been replaced.

The normal cell block that is replaced may be a half-block, with only half as many memory cells as the defective cell block, or may be a smaller fraction of a block. If the defective cell block has defective memory cells near both edges, the normal blocks or fractional blocks adjacent to both edges may be replaced with redundant blocks or redundant fractional blocks.

The invention also provides a method of selecting redundant memory cells in the first and second redundant cell blocks. The method includes storing the address of the defective cell block, generating a first redundant address signal selecting the first redundant cell block from the stored address of the defective cell block and an input address signal selecting the defective cell block, and generating a second redundant address signal selecting the second redundant cell block from the stored address of the defective cell block and an input address signal selecting a normal cell block or fractional block adjacent to the defective cell block. The second redundant address signal may be generated by incrementing or decrementing the stored address of the defective cell block, appending one or more '0' bits or one or more '1' bits, and comparing the result with the input address.

The invented redundancy repair method provides greater operating temperature and voltage margins than conventional methods that replace only the defective block of memory cells, and reduces the probability of failure due to gradual degradation of a defective memory cell. The invented method of selecting memory cells is also simpler than conventional methods in which redundancy repair is carried out on a line-by-line basis.

DETAILED DESCRIPTION OF THE INVENTION

Figure 1:
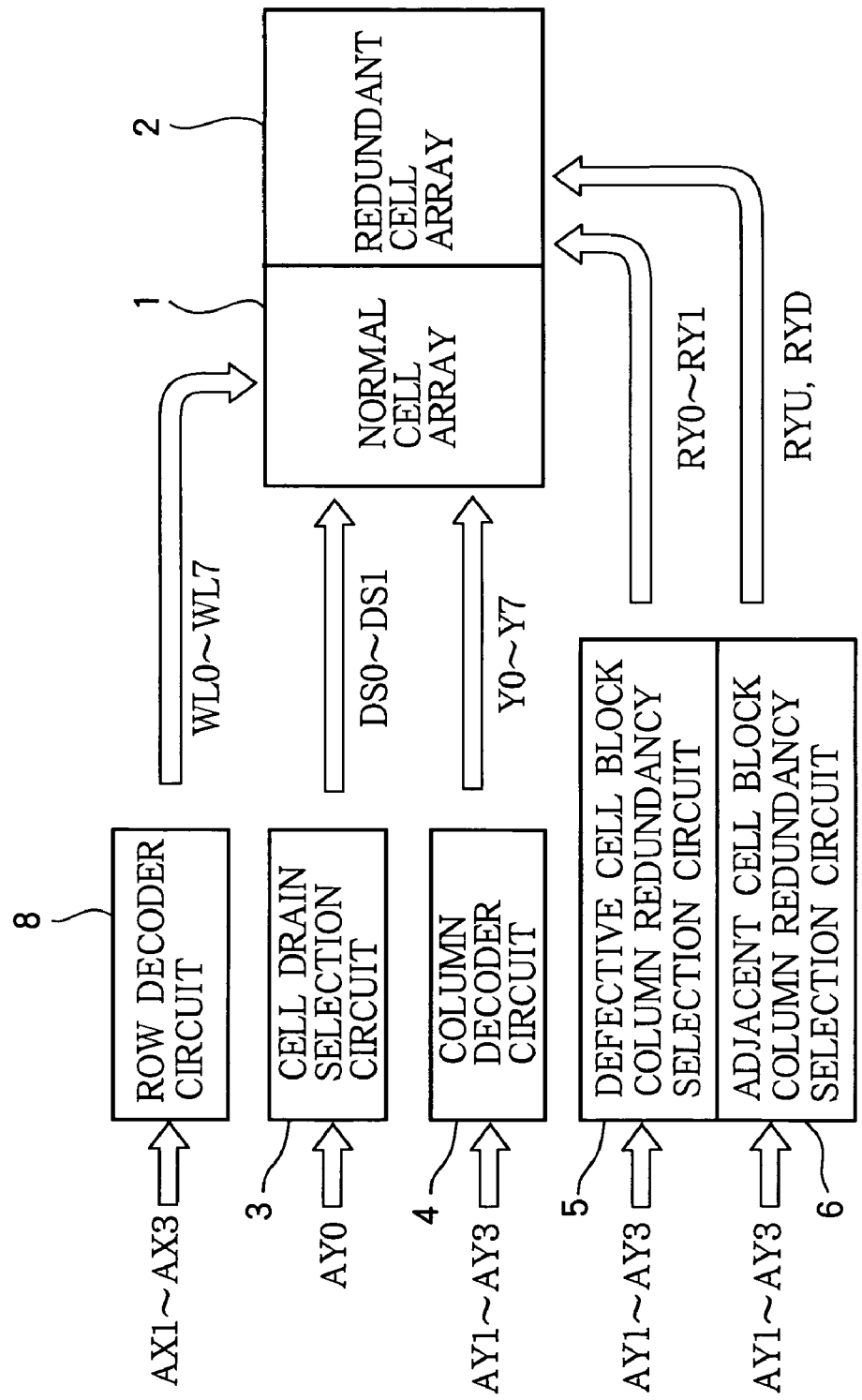
FIG. 1 is a block diagram of a semiconductor memory according to a first embodiment of the invention.

Embodiments of the invention will now be described with reference to the attached drawings, in which like elements are indicated by like reference characters.

First Embodiment

Figure 8:
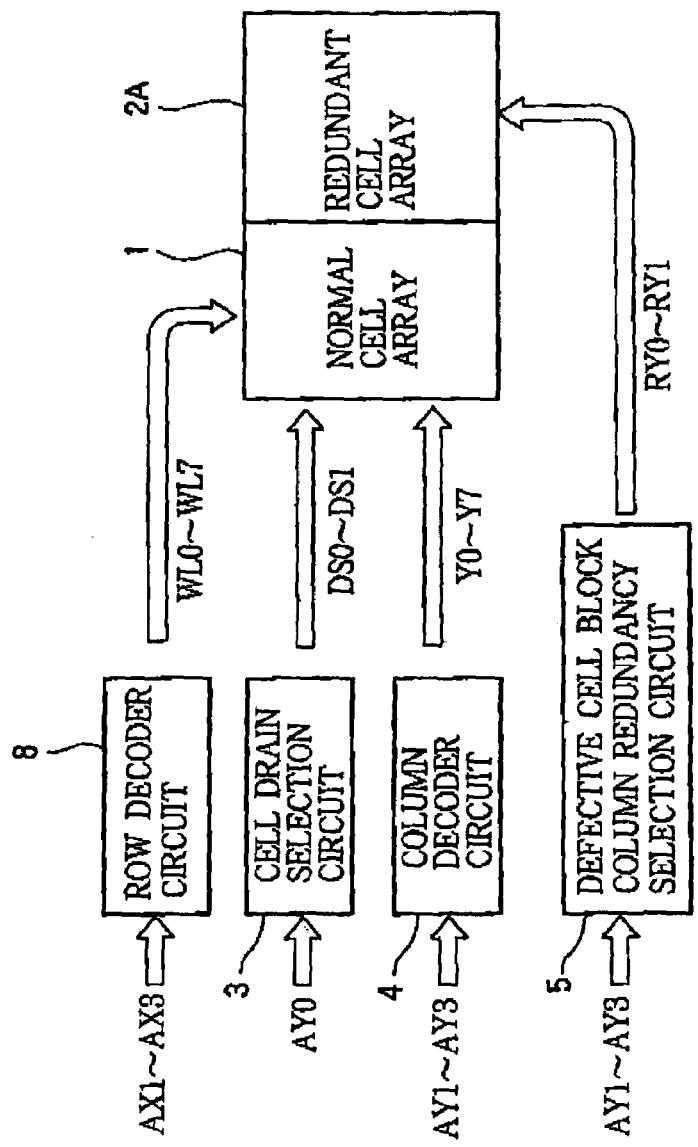
FIG. 8 is a block diagram of a conventional PROM.

Referring to FIG. 1, the semiconductor memory according to the first embodiment includes a normal cell array 1, a redundant cell array 2, a cell drain selection circuit 3, a column decoder circuit 4, a defective cell block column redundancy selection circuit 5, an adjacent cell block column redundancy selection circuit 6, and a row decoder circuit 8. The difference between this semiconductor memory and the conventional memory shown in FIG. 8 is the presence of the adjacent cell block column redundancy selection circuit 6 and an enlargement of the redundant cell array 2. Both memories receive four column address signals AY0, AY1, AY2, AY3 and three row address signals AX1, AX2, AX3.

Figure 2:
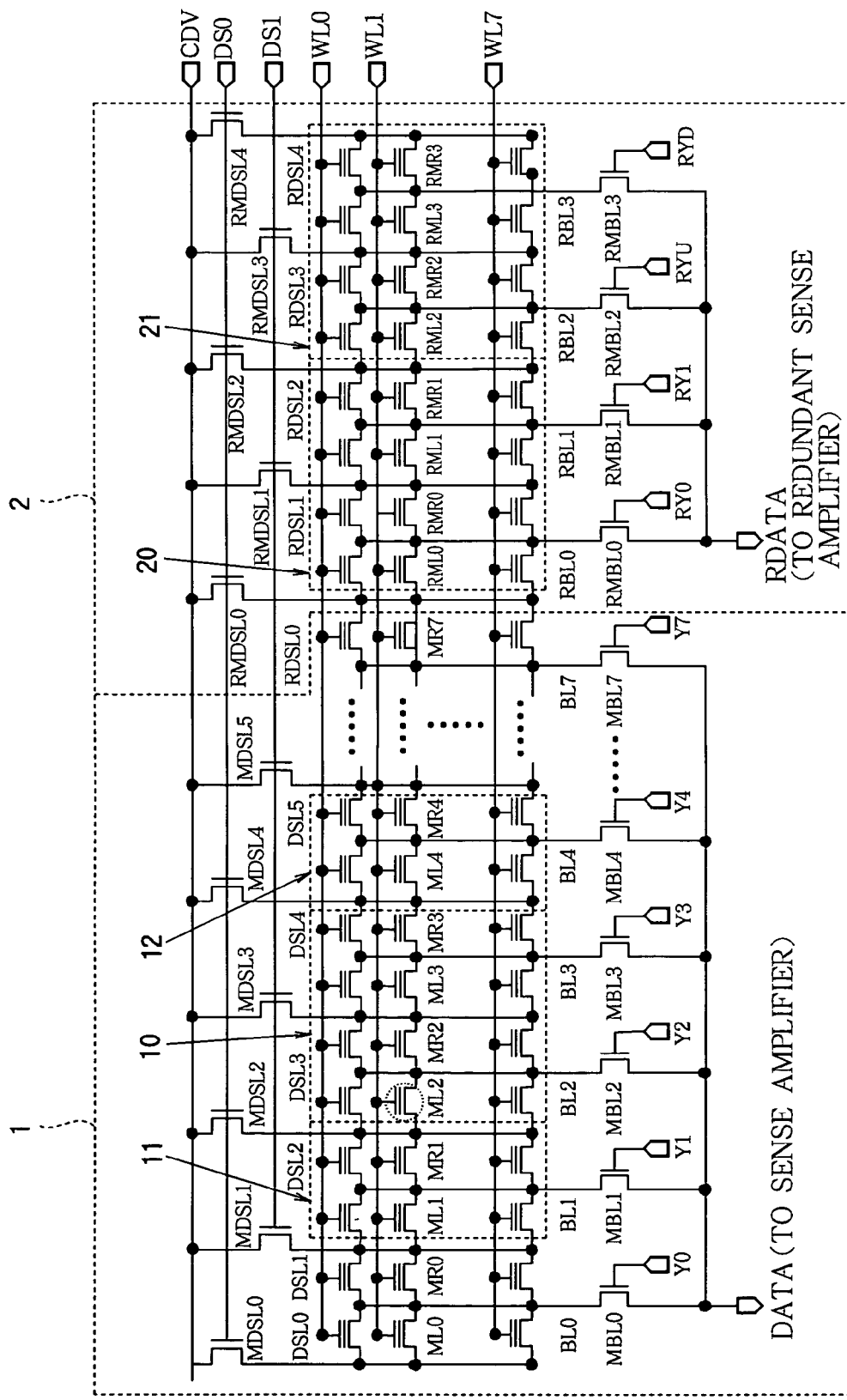
FIG. 2 is a circuit diagram of the normal and redundant cell arrays in FIG. 1.

Referring to FIG. 2, the normal cell array 1 accordingly has 16×8 memory cell transistors, sixteen of which (ML0, MR0, ML1, MR1, . . . , ML7, MR7) receive word line select signal WL1. Current is supplied to the normal cell array 1 through memory cell drain select transistors MDSL0, MDSL1, . . . , MDSL7; data signals are read out through column switch transistors MBL0, MBL1, . . . , MBL7.

In the normal cell array 1, normal cells ML2, MR2, ML3, MR3 and other normal cells in the same columns constitute one cell block 10. Similarly, normal cells ML0, MR0, ML1, MR1 and other normal cells in the same columns constitute another cell block; normal cells ML4, MR4, ML5, MR5 and other normal cells in the same columns constitute still another cell block; normal cells ML6, MR6, ML7, MR7 and other normal cells in the same columns constitute yet another cell block (the columns including cells ML5, MR5, ML6, MR6, and ML7 are not shown).

In FIG. 2, the redundant cell array 2 comprises 8×8 redundant cells containing redundant memory cell transistors (redundant cells), eight of which (RML0, RMR0, RML1, RMR1, . . . , RML3, RMR3) receive word line select signal WL1. Current is supplied to the redundant cell array 2 through redundant memory cell drain select transistors RMDSL0, RMDSL1, RMDSL2, . . . , RMDSL4; data signals are read out through redundant column switch transistors RMBL0, RMBL1, . . . , RMBL3.

Figure 9:
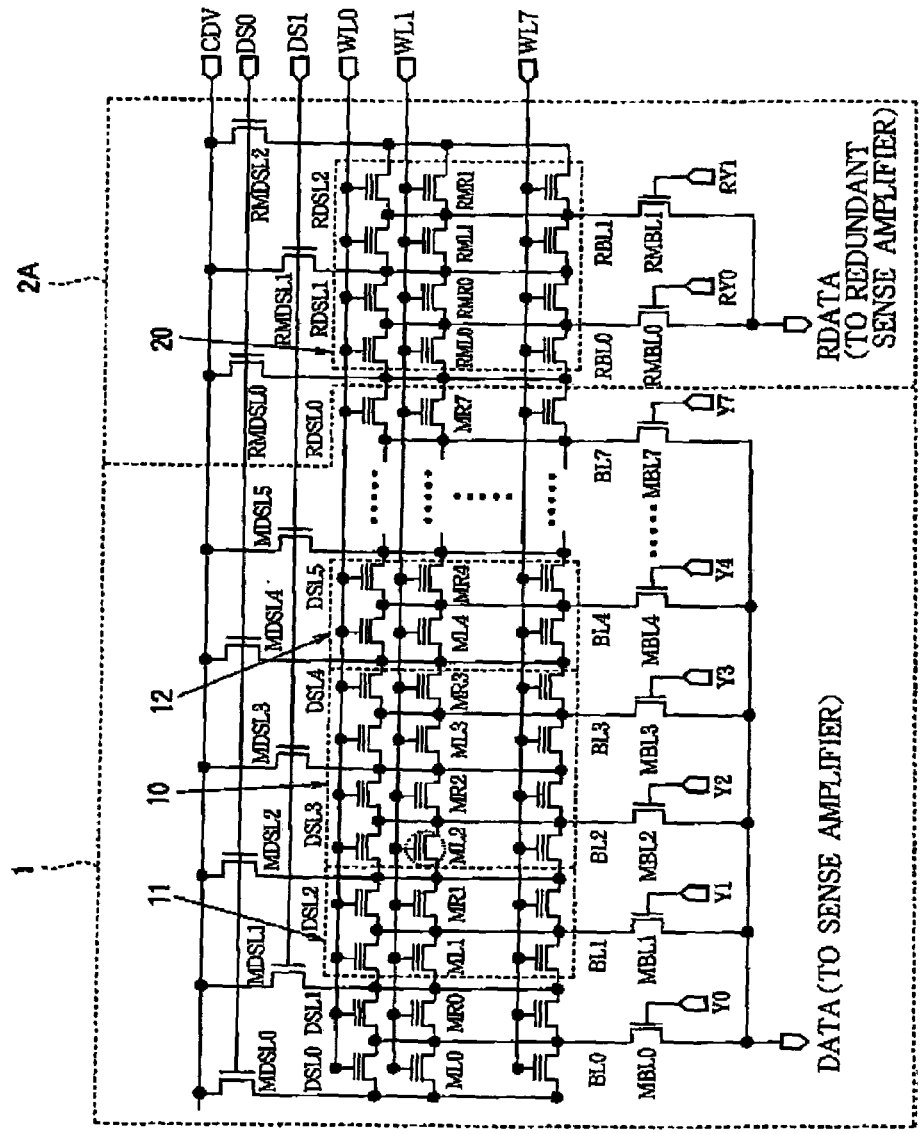
FIG. 9 is a circuit diagram of the normal and redundant cell arrays in FIG. 8.

In redundant cell array 2, redundant cells RML0, RMR0, RML1, RMR1 and other redundant cells in the same redundant columns constitute a first redundant cell block 20 for replacing a defective cell block (e.g. cell block 10) in the normal cell array 1. Redundant cells RML2, RMR2, RML3, RMR3 and other redundant cells in the same columns constitute a second redundant cell block 21 for replacing a non-defective cell block adjacent to the defective cell block. More accurately, one or two non-defective half-blocks can be replaced. For example, if cell block 10 is defective, the memory cells in redundant cell block 21 may be used to replace adjacent half-block 11 (located to the left of cell block 10), adjacent half-block 12 (located to the right of cell block 10), or both adjacent half-blocks 11 and 12. The presence of redundant cell block 21 distinguishes the redundant cell array 2 in embodiment 1 from the conventional redundant cell array 2A in FIGS. 8 and 9.

Bit line BL0 is connected to cell drain select line DSL0 through normal cell ML0 and seven other normal cells in the same column, and to cell drain select line DSL1 through normal cell MR0 and seven normal cells in the same column. Similarly, bit lines BL1, BL2, . . . , BL7 are connected to cell drain select lines DSL1, DSL2, . . . , DSL7, respectively, through normal cells ML1, ML2, . . . , ML7, and seven other normal cells in the same column, and to cell drain select lines DSL2, DSL3, . . . , and redundant cell drain select line RDSL0, respectively through normal cells MR1, MR2, . . . , MR7 and seven other normal cells in the same column.

Redundant bit line RBL0 is connected to redundant cell drain select line RDSL0 through redundant cell RML0 and seven redundant cells in the same column, and to redundant cell drain select line RDSL1 through redundant cell RMR0 and seven redundant cells in the same column. Similarly, redundant bit lines RBL1, RBL2, RBL3 are connected to redundant cell drain select lines RDSL1, RDSL2, RDSL3, respectively, through redundant cells RML1, RML2, RML3 and seven redundant cells in the same column, and to redundant cell drain select lines RDSL2, RDSL3, RDSL4, respectively, through redundant cells RMR1, RMR2, RMR3 and seven redundant cells in the same column.

Word select signal WL1 is input to the gate electrodes of normal cells ML0, MR0, ML1, MR1, ..., ML7 (not shown), MR7 and the redundant cells RML0, RMR0, RML1, RMR1, ..., RML3, RMR3 in the same row, connected to the same word line. Similarly, each of the other word line select signals WL0, WL2, ..., WL7 is input to the gate electrodes of sixteen normal cells and eight redundant cells disposed in a single row, on a single word line, in the same columns as normal cells ML0, MR0, ML1, MR1, ..., ML7, MR7 and redundant cells RML0, RMR0, RML1, RMR1, ..., RML3, RMR3.

The cell drain select lines DSL0, DSL1, ..., DSL7 are connected to a cell drain voltage (CDV) power supply through respective cell drain select transistors MDSL0, MDSL1, ..., MDSL7. The redundant cell drain select lines RDSL0, RDSL1, ..., RDSL4 are connected to the same CDV power supply through respective redundant cell drain select transistors RMDSL0, RMDSL1, ..., RMDSL4.

A cell drain select signal DS0 is input to the gate electrodes of the even-numbered cell drain select transistors MDSL0, MDSL2, MDSL4, MDSL6 and redundant cell drain select transistors RMDSL0, RMDSL2, RMDSL4. Another cell drain select signal DS0 is input to the gate electrodes of the odd-numbered cell drain select transistors MDSL1, MDSL3, MDSL5, MDSL7 and redundant cell drain select transistors RMDSL1, RMDSL3.

Bit lines BL0, BL1, ..., BL7 are connected through respective column switch transistors MBL0, MBL1, ..., MBL7 to an output terminal from which a read-out data signal (DATA) is supplied to a sense amplifier (not shown). Redundant bit lines RBL0, RBL1, ..., RBL3, are connected through respective redundant column switch transistors RMBL0, RMBL1, ..., RMBL3 to a redundant output terminal from which a redundant read-out data signal (RDATA) is supplied to a redundant sense amplifier (not shown).

Column select signals Y0, Y1, ..., Y7 are input to the gate electrodes of the column switch transistors MBL0, MBL1, ..., MBL7. Column redundant select signal RYO is input to the gate electrode of redundant column switch transistor RMBL0, redundant column select signal RY1 is input to the gate electrode of redundant column switch transistor RMBL1, upper redundant column select signal RYU is input to the gate electrode of redundant column switch transistor RMBL2, and lower redundant column select signal RYD is input to the gate electrode of redundant column switch transistor RMBL3.

The cell drain selection circuit 3 selects the memory cells connected to the left or right of each bit line, depending on the value of address signal AY0. When AY0 is low, the cell drain selection circuit 3 drives cell drain select signal DS0 high and cell drain select signal DS1 low, selecting the memory cells connected to the left of the even-numbered bit lines MBL0, MBL2, ..., MBL6 and the memory cells connected to the right of the odd-numbered bit lines MBL1, MBL3, ..., MBL7. When AY0 is high, the cell drain selection circuit 3 drives cell drain select signal DS0 low and cell drain select signal DS1 high, selecting the memory cells connected to the right of the even-numbered bit lines MBL0, MBL2, ..., MBL6 and the memory cells connected to the left of the odd-numbered bit lines MBL1, MBL3, ..., MBL7.

Figure 3:
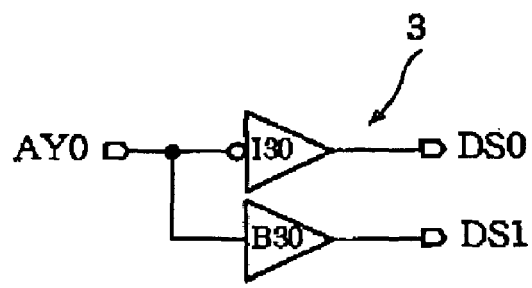
FIG. 3 is a circuit diagram of the cell drain selection circuit in FIG. 1.

FIG. 3 shows an exemplary circuit structure of the cell drain selection circuit 3. The cell drain selection circuit 3 in FIG. 3 comprises an inverter 130 and a buffer B30. Column address signal AY0 is input to the inverter 130 and the buffer B30; the inverter 130 outputs cell drain select signal DS0, and the buffer B30 outputs cell drain select signal DS1.

Figure 4:
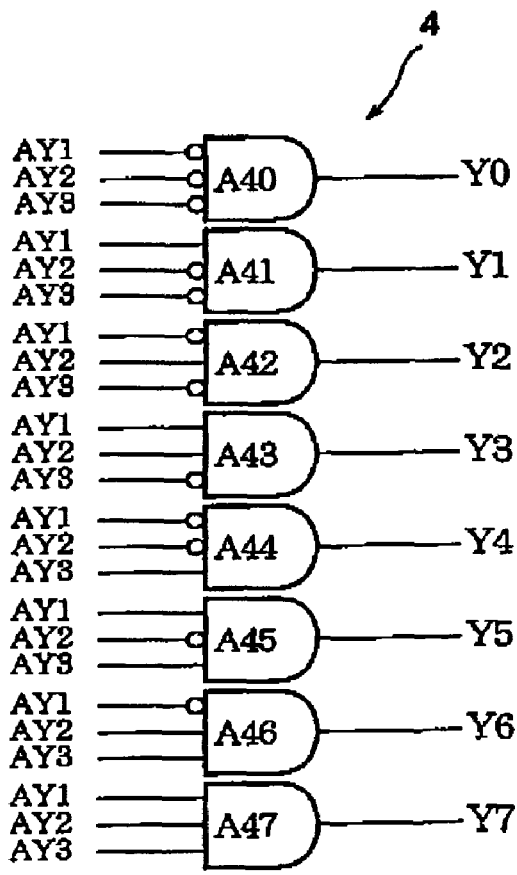
FIG. 4 is a circuit diagram of the column decoder circuit in FIG. 1.

FIG. 4 shows an exemplary circuit structure of the column decoder circuit 4, which generates the column select signals Y0, Y1, ..., Y7. The column decoder circuit 4 in FIG. 4 comprises three-input AND gates A40, A41, ..., A47. AND gate A40 receives inverted copies of column address signals AY1, AY2, AY3 as inputs, and outputs column select signal Y0. AND gate A41 receives column address signal AY1 and inverted copies of column address signals AY2, AY3 as inputs, and outputs column select signal Y1. AND gate A42 receives column address signal AY2 and inverted copies of column address signals AY1 and AY3 as inputs, and outputs column select signal Y2. AND gate A43 receives column address signals AY1 and AY2 and an inverted copy of column address signal AY3 as inputs, and outputs column select signal Y3. AND gate A44 receives column address signal AY3 and inverted copies of column address signals AY1 and AY2 as inputs, and outputs column select signal Y4. AND gate A45 receives column address signals AY1 and AY3 and an inverted copy of column address signal AY2 as inputs, and outputs column select signal Y5. AND gate A46 receives column address signals AY2 and AY3 and an inverted copy of column address signal AY1 as inputs, and outputs column select signal Y6. AND gate A47 receives column address signals AY1, AY2, AY3 as inputs, and outputs column select signal Y7.

Figure 5:
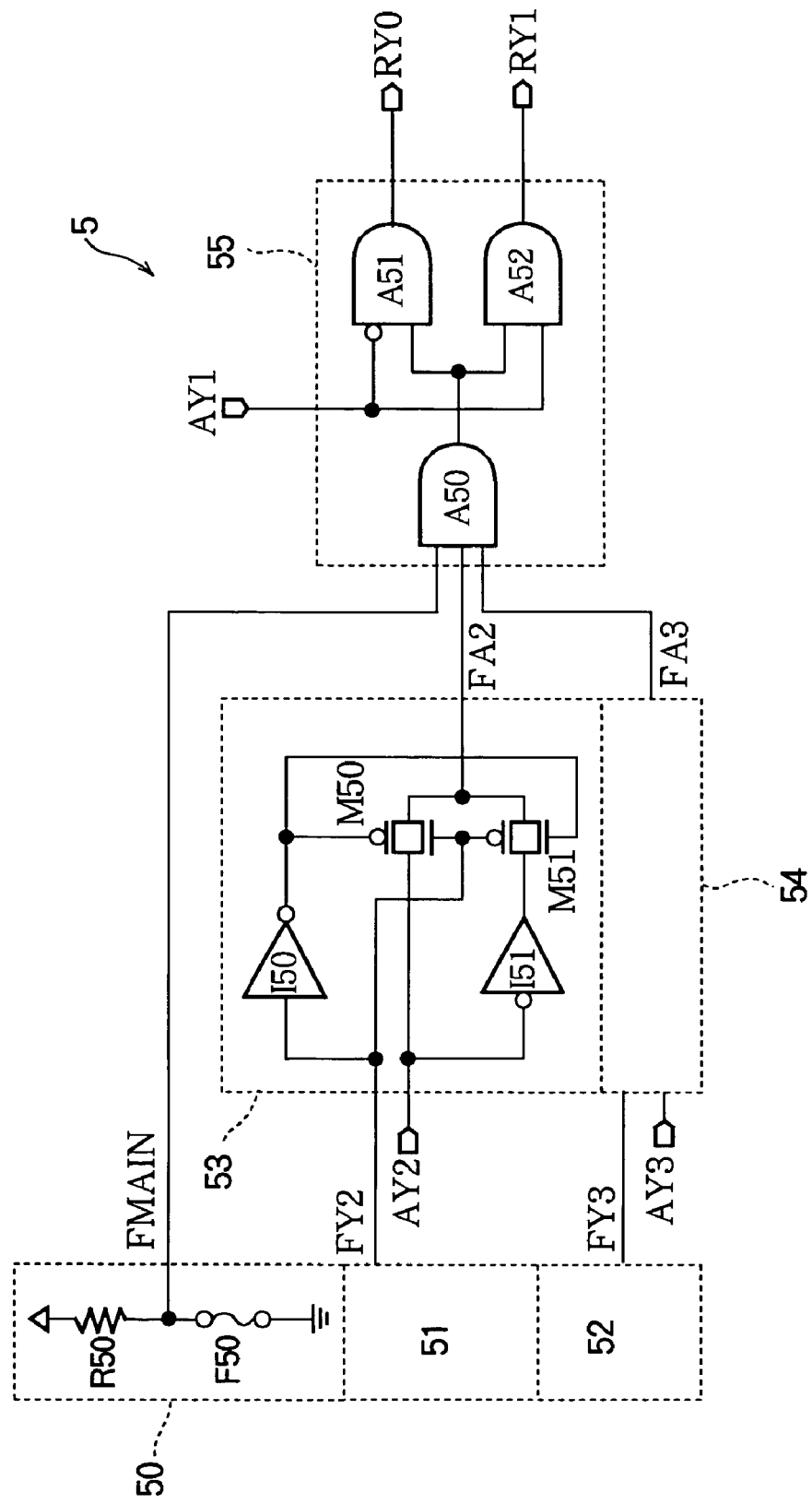
FIG. 5 is a circuit diagram of the defective cell block column redundancy selection circuit in FIG. 1.

FIG. 5 shows an exemplary circuit structure of the defective cell block column redundancy selection circuit 5, which generates the column select signals RY0, RY1 for the first redundant cell block 20. The defective cell block column redundancy selection circuit 5 in FIG. 5 comprises three fuse-programmable circuits 50, 51, 52, two address selection circuits 53, 54, and an address decoding circuit 55.

Fuse-programmable circuit 50 generates a redundancy enable signal FMAIN that is programmed to the high logic level when redundancy repair is necessary and to the low logic level when redundancy repair is not necessary. When redundancy repair is necessary, fuse-programmable circuits 51 and 52 store the address of the defective cell block.

The fuse-programmable circuits 50, 51, and 52 have identical structures, each including a resistor and fuse. In fuse-programmable circuit 50, for example, one end of the resistor R50 is connected to a power supply node, one end of the fuse F50 is connected to the other end of the resistor R50, and the other end of the fuse F50 is connected to a ground node. The redundancy enable signal FMAIN is output from a node at which the resistor R50 and fuse F50 of fuse-programmable circuit 50 are interconnected. A fuse programmable address signal FY2 is output from a node at which the resistor and fuse in fuse-programmable circuit 51 are interconnected. Another fuse programmable address signal FY3 is output from a node at which the resistor and fuse in fuse programmable circuit 52 of are interconnected.

The address selection circuits 53 and 54 are identically structured as exclusive-NOR (EXNOR) gates, each including a pair of inverters I50, I51 and a pair of MOS switches M50 and M51. Each address selection circuit compares one address bit with one fuse programmable address signal and generates a redundant column address signal. The redundant column address signal is high if the address bit and fuse programmable address signal have the same logic level, and low if they have different logic levels.

More specifically, address selection circuit 53 selects column address signal AY2 or an inverted copy thereof according to the logic level of fuse programmable address signal FY2, and outputs the selected signal as a redundant column address signal FA2. Address selection circuit 54 selects column address signal AY3 or an inverted copy thereof the according to the logic level of fuse programmable address signal FY3, and outputs the selected signal as a redundant column address signal FA3.

In the address selection circuit 53, fuse programmable address signal FY2 is input to inverter I50, the gate electrode of the n-channel metal-oxide-semiconductor (NMOS) transistor of MOS switch M50, and the gate electrode of the p-channel metal-oxide-semiconductor (PMOS) transistor of MOS switch M51. The inverted copy of fuse programmable address signal FY2 output from inverter I50 is input to the gate electrode of the PMOS transistor of MOS switch M50 and the gate electrode of the NMOS transistor of MOS switch M51. Therefore, when MOS switch M50 is on, MOS switch M51 is off, and when MOS switch M50 is off, MOS switch M51 is on. Column address signal AY2 is input to MOS switch M50 and inverter I51, and the inverted copy of column address signal AY2 output from inverter I51 is input to MOS switch M51. The outputs of MOS switches M50 and M51 are interconnected at a node from which redundant column address signal FA2 is output.

In identically structured address selection circuit 54, fuse programmable address signal FY3 is input to inverter I50, the gate electrodes of the NMOS transistor of MOS switch M50, and the gate electrode of the PMOS transistor of MOS switch M51 (the inverters I50, I51 and MOS switches M50, M51 in address selection circuit 54 are not shown). The inverted copy of fuse programmable address signal FY3 output from inverter I50 is input to the gate electrode of the PMOS transistor of MOS switch M50 and the gate electrode of the NMOS transistor of MOS switch M51. As in address selection circuit 53, when MOS switch M50 is on, MOS switch M51 is off, and when MOS switch M50 is off, MOS switch M51 is on. Column address signal AY3 is input to MOS switch M50 and inverter I51, and the inverted copy of column address signal AY3 output from inverter I51 is input to MOS switch M51. The outputs of MOS switches M50 and M51 are interconnected at a node from which redundant column address signal FA3 is output.

The address decoding circuit 55 generates the redundant column select signals RY0, RY1 from column address signal AY1, redundant column address signals FA2, FA3, and the redundancy enable signal FMAIN. The address decoding circuit 55 comprises a three-input AND gate A50 and a pair of two-input AND gates A51 and A52. Redundancy enable signal FMAIN and redundant column address signals FA2 and FA3 are input to AND gate A50. AND gate A51 receives the output signal of AND gate A50 and an inverted copy of column address signal AY1 as inputs, and outputs redundant column select signal RY0. AND gate A52 receives the output signal of AND gate A50 and column address signal AY1 as inputs, and outputs redundant column select signal RY1.

Figure 6A:
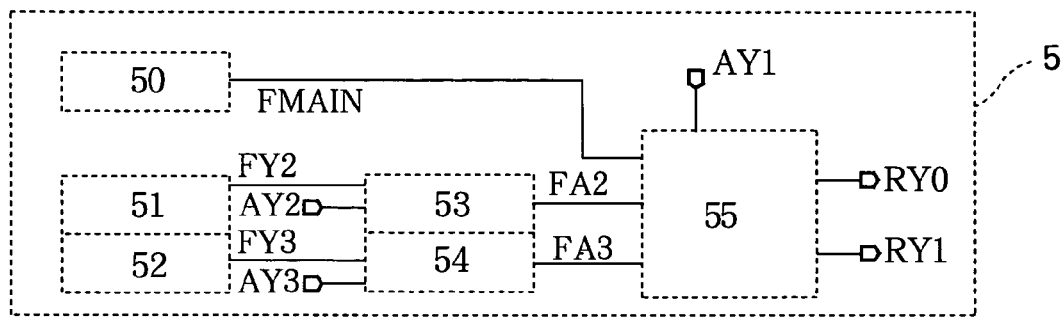
FIG. 6A is a simplified diagram of the circuit in FIG. 5.
Figure 6B:
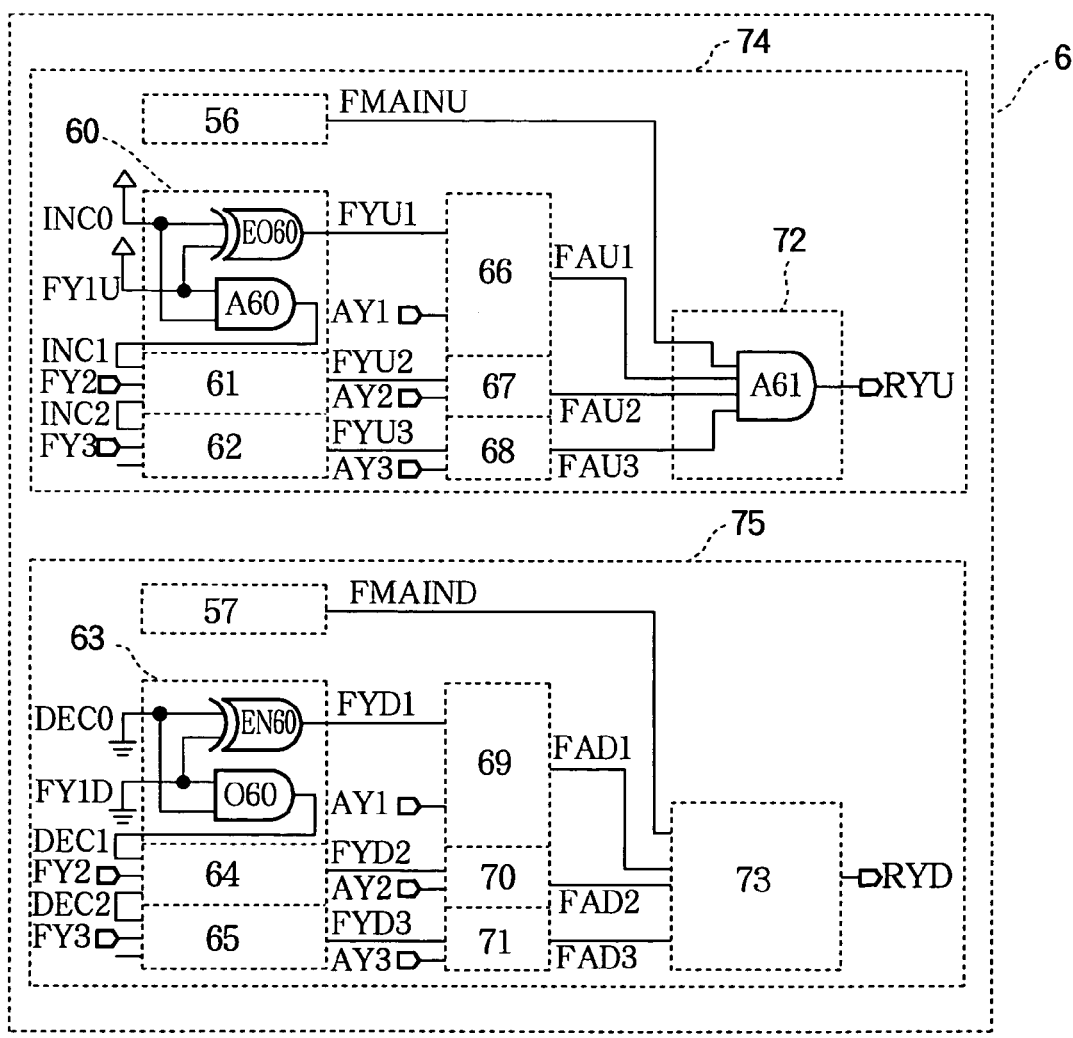
FIG. 6B is a simplified circuit diagram of the adjacent cell block column redundancy selection circuit in FIG. 1.

FIG. 6A shows a schematic representation of the circuit structure of the defective cell block column redundancy selection circuit 5 in FIG. 5. FIG. 6B shows a similarly schematic representation of the circuit structure of the adjacent cell block column redundancy selection circuit 6. The adjacent cell block column redundancy selection circuit 6 comprises fuse-programmable circuits 56, 57, adjacent address generating circuits 60, 61, 62, 63, 64, 65, address selection circuits 66, 67, 68, 69, 70, 71, and address decoding circuits 72, 73. Fuse-programmable circuit 56, adjacent address generating circuits 60, 61, 62, address selection circuits 66, 67, 68, and address decoding circuit 72 constitute an upper column redundancy selection circuit 74; fuse-programmable circuit 57, adjacent address generating circuits 63, 64, 65, address selection circuits 69, 70, 71, and address decoding circuit 73 constitute a lower column redundancy selection circuit.

The adjacent cell block column redundancy selection circuit 6 selects one half of redundant cell block 21 to replace a half-block adjacent to a defective cell block in the normal cell array 1. As inputs, both the upper and lower column redundancy selection circuits 74, 75 receive column address signals AY1, AY2, AY3 and the fuse programmable address FY3, FY2 of the defective block cell. The fuse programmable address signals FY3, FY2 are received from fuse-programmable circuits 51 and 52 in the defective cell block column redundancy selection circuit 5.

Upper column redundancy selection circuit 74 is programmable to select the lower half of redundant cell block 21 by driving the upper redundant column select signal RYU. The lower half of redundant cell block 21 is used to replace a normal half-block near a defective cell located in the upper (right) half of a defective cell block. Lower column redundancy selection circuit 75 is programmable to select the upper half of redundant cell block 21 by driving the lower redundant column select signal RYD. The upper half of redundant cell block 21 is used to replace a normal half-block near a defective cell located in the lower (left) half of a defective cell block.

Fuse-programmable circuits 56 and 57 have same structure as fuse-programmable circuits 50, 51 and 52 in the defective cell block column redundancy selection circuit 5, each comprising a resistor and fuse connected in series between the power supply and ground to generate an output signal from the node at which they are interconnected. Fuse-programmable circuit 56 generates an upper redundancy enable signal FMAINU; fuse-programmable circuit 57 generates a lower redundancy enable signal FMAIND.

Adjacent address generating circuits 60, 61, and 62 form an incrementer that increments the fuse-programmable address FY3, FY2 of the defective cell block and appends a '0' bit, thereby generating the address of the upper-adjacent (right-adjacent) half-block. These circuits 60, 61, 62 have identical half-adder structures, each comprising a two-input exclusive-OR (EXOR) gate EO60 and a two-input AND gate A60. In adjacent address generating circuit 60, the EXOR gate EO60 takes the exclusive logical OR of two input signals INC0 and FY1U that are both tied to the high logic level, and outputs a first upper fuse programmable address signal FYU1 that is held at the low logic level. The AND gate A60 in adjacent address generating circuit 60 takes the logical AND of the same two input signals INC0 (high) and FY1U (high), and outputs a signal INC1 that is held at the high logic level. The EXOR gate in adjacent address generating circuit 61 takes the exclusive logical OR of INC1 (high) and fuse programmable address signal FY2, and outputs a second upper fuse programmable address signal FYU2, while the AND gate in adjacent address generating circuit 61 takes the logical AND of INC1 (high) and FY2, and outputs a carry signal INC2. The EXOR gate in adjacent address generating circuit 62 takes the logical exclusive OR of INC2 and fuse programmable address signal FY3, and outputs a third upper fuse programmable address signal FYU3.

Adjacent address generating circuits 63, 64, and 65 form a decrementer that decrements the fuse-programmable address FY3, FY2 of the defective cell block and appends a '1' bit, thereby generating the address of the lower-adjacent (left-adjacent) half-block. These circuits 63, 64, 65 have identical structures, each comprising a two-input exclusive-NOR (EXNOR) gate EN60 and a two-input OR gate 060. In adjacent address generating circuit 63, the EXNOR gate EN60 takes the logical exclusive NOR of two input signals DEC0 and FY1D that are tied to the low logic level, and outputs a first lower fuse programmable address signal FYD1 that is held at the high logic level; the OR gate 060 takes the logical OR of input signals DEC0 (low) and FY1D (low) and outputs a signal DEC1 that is held at the low logic level. The EXNOR gate in adjacent address generating circuit 64 takes the logical exclusive NOR of DEC1 (low) and FY2, and outputs a second lower fuse programmable address signal FYD2, while the OR gate in adjacent address generating circuit 64 takes the logical OR of DEC1 (low) and FY2, and outputs a signal DEC2. The EXNOR gate in adjacent address generating circuit 65 takes the logical exclusive NOR of DEC2 and FY3, and outputs a third lower fuse programmable address signal FYD3.

The AND gate in adjacent address generating circuit 62 and the OR gate in adjacent address generating circuit 65 are not used and may be omitted.

Address selection circuits 66, 67, 68, 69, 70 and 71 have the same structure as address selection circuits 53 and 54 in the defective cell block column redundancy selection circuit 5 (see FIG. 5), each comprising a pair of inverters I50, I51 and a pair of MOS switches M50, M51 interconnected to function as an EXNOR gate. These circuits compare input column address signals A3, A2, A1 individually with the upper fuse programmable address signals FYU3, FYU2, FYU1 and the lower fuse programmable address signals FYD3, FYD2, FYD1 to determine whether or not they match.

In upper column redundancy selection circuit 74, address selection circuit 66 selects column address signal AY1 or an inverted copy thereof according to the first upper fuse programmable address signal FYU1, and outputs a first upper redundant column address signal FAU1. Address selection circuit 67 selects column address signal AY2 or an inverted copy thereof according to the second upper fuse programmable address signal FYU2, and outputs a second upper redundant column address signal FAU2. Address selection circuit 68 selects column address signal AY3 or an inverted copy thereof according to the third upper fuse programmable address signal FYU3, and outputs a third upper redundant column address signal FAU3.

In lower column redundancy selection circuit 75, address selection circuit 69 selects column address signal AY1 or an inverted copy thereof according to the first lower fuse programmable address signal FYD1, and outputs a first redundant column lower address signal FAD1. Address selection circuit 70 selects column address signal AY2 or an inverted copy thereof according to the second lower fuse programmable address signal FYD2, and outputs a second redundant column lower address signal FAD2. Address selection circuit 71 selects column address signal AY3 or an inverted copy thereof according to the third programmable lower address signal FYD3, and outputs a third redundant column lower address signal FAD3.

Address decoding circuits 72 and 73 have identical structures, each comprising a four-input AND gate A61. The AND gate A61 in address decoding circuit 72 receives the upper redundancy enable signal FMAINU and upper redundant column address signals FAU1, FAU2 and FAU3 as inputs, and outputs the upper redundant column select signal RYU. The similar AND gate (not shown) in address decoding circuit 73 receives the lower redundancy enable signal FMAIND and lower redundant column address signals FAD1, FAD2 and FAD3 as inputs, and outputs the lower redundant column select signal RYD.

Figure 7:
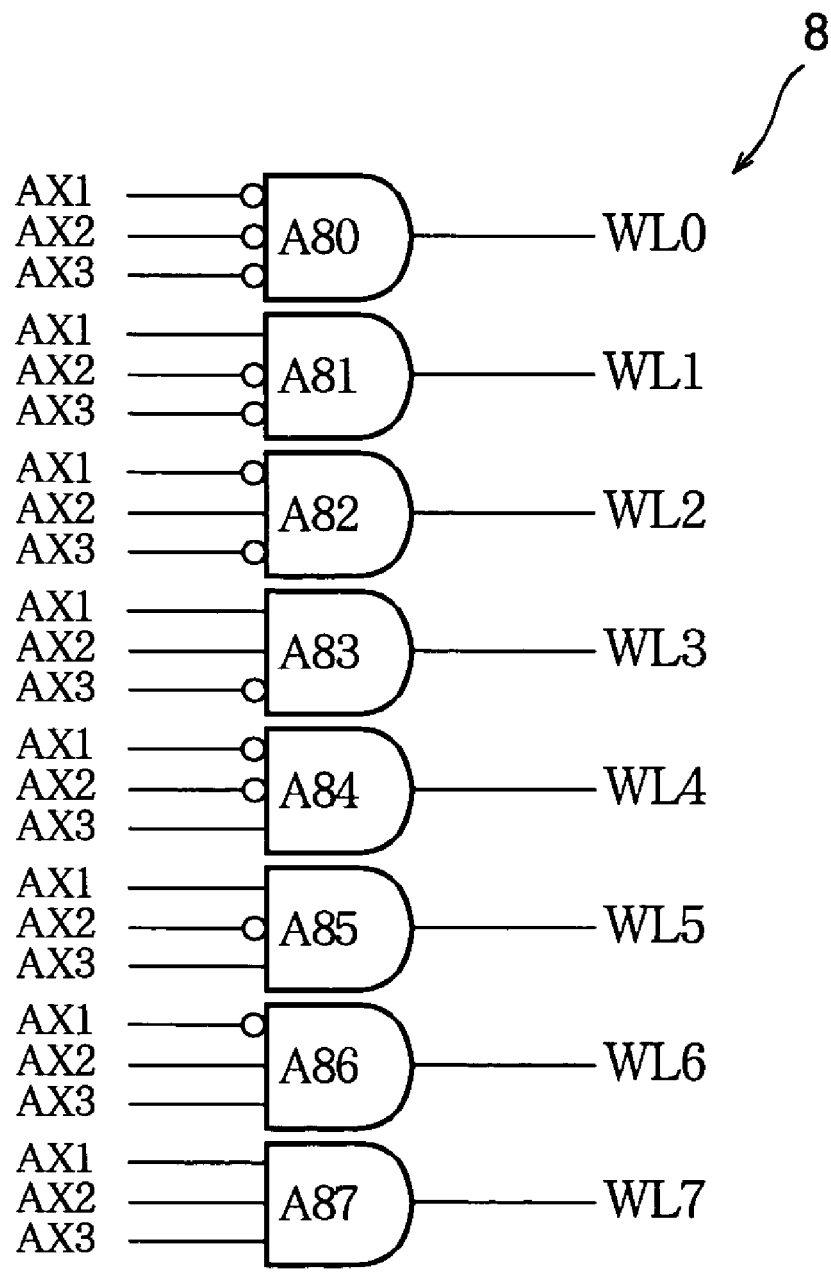
FIG. 7 is a circuit diagram of the row decoder circuit in FIG. 1.

FIG. 7 shows the circuit structure of the row decoder circuit 8. The row decoder circuit 8 comprises three-input AND gates A80, A81, ..., A87. AND gate A80 receives inverted copies of row address signals AX1, AX2, and AX3 as inputs, and outputs word line select signal WL0. AND gate A81 receives row address signal AX1 and inverted copies of row address signals AX2 and AX3 as inputs, and outputs word line select signal WL1. AND gate A82 receives row address signal AX2 and inverted copies of row address signal AX1 and AX3 as inputs, and outputs word line select signal WL2. AND gate A83 receives row address signals AX1 and AX2 and an inverted copy of row address signal AX3 as inputs, and outputs word line select signal WL3. AND gate A84 receives row address signal AX3 and inverted copies of row address signal AX1 and AX2 as inputs, and outputs word line select signal WL5. AND gate A85 receives row address signals AX1 and AX3 and an inverted copy of row address AX2 as inputs, and outputs word line select signal WL5. AND gate A86 receives row address signals AX2 and AX3 and an inverted copy of row address AX1 as inputs, and outputs word line select signal WL6. AND gate A87 receives row address signals AX1, AX2, AX3 as inputs, and outputs word line select signal WL7.

Another circuit (not shown) selects the output of the normal sense amplifier when all of the redundant column select signals RY0, RY1, RYU, RYD are low and selects the output of the redundant sense amplifier when one of the redundant column select signals RY0, RY1, RYU, RYD is high.

Normal Data Read-Out

Next, the reading of data from cell ML2 in cell block 10 in FIG. 2 will be described Under the assumption that cell block 10 is non-defective, using the letters H and L to indicate the high ('1') and low ('0') logic levels, respectively.

If the column address signal inputs (AY0, AY1, AY2, AY3) are (L, L, H, L) and the row address signals (AX1, AX2, AX3) are (H, L, L) are input, then the outputs (DS0, DS1) of the cell drain selection circuit 3 are (H, L), the outputs (Y0, Y1, Y2, Y3-Y7) of the column decoder circuit 4 are (L, L, H, L), and the outputs (WL0, WL1, WL2-WL7) of the row decoder circuit 8 are (L, H, L). These signals select normal cell ML2 and read out its data as follows.

As cell drain select signal DS0 is high, cell drain select transistor MDSL2 turns on and the cell drain voltage CDV is supplied to cell drain select line DSL2. As word line select signal WL1 is high, the memory cell transistors that have been programmed to the low threshold level in the row including cells ML0 to MR7 and redundant cells RML0 to RMR3 turn on.

As column address signals (AY3, AY2, AY1) are (L, H, L) the column select signals (Y0, Y1, Y2, Y3-Y7) output from the column decoder circuit 4 are (L, L, H, L) and column switch transistor MBL2 turns on.

By activating word line select signal WL1 and turning on cell drain select transistor MDSL2 and column switch transistor MBL2, address signals (AY0, AY1, AY2, AY3, AX1, AX2, AX3) with values (L, L, H, L, H, L, L) select normal cell ML2. The read-out data signal (DATA) output from the output terminal of the normal cell array 1 is amplified by the sense amplifier (not shown), going high or low depending on whether normal cell ML2 has been programmed to the low-threshold or high-threshold state.

Redundancy Repair (1)

If cell ML2 is defective, its cell block 10 is replaced with redundant cell block 20 in the redundant cell array 2, and the half-block 11 on the left side of cell block 10, adjacent to the defective cell ML2, is replaced with the upper of the two redundant half-blocks in redundant cell block 21. As a result, normal cell ML1 is replaced by redundant cell RML3, normal cell MR1 by redundant cell RMR3, defective cell ML2 by redundant cell RML0, normal cell MR2 by redundant cell RMR0, normal cell ML3 by redundant cell RML1, and normal cell MR3 by redundant cell RMR1.

In general, when any cell connected to the leftmost bit line BL2 in cell block 10 is defective, the adjacent half-block 11 is replaced with the upper half-block of redundant cell block 21 in the redundant cell array 2. The procedure for redundancy repair of cell block 10 with redundant cell block 20 and replacement of half-block 11 with the upper half-block of redundant cell block 21 includes the cutting of fuses in the defective cell block column redundancy selection circuit 5 and lower column redundancy selection circuit 75.

In the defective cell block column redundancy selection circuit 5, fuse F50 in fuse-programmable circuit 50 is cut to enable redundancy repair. When the defective cell ML2 is selected, column address signals (AY3, AY2, AY1) have values (L, H, L) as column address signal AY2 is high, the fuse in fuse-programmable circuit 51 is cut, and as column address signal AY3 is low, the fuse in fuse-programmable circuit 52 is left connected. Therefore, the outputs (FMAIN, FY2, FY3) of fuse-programmable circuits 50, 51, 52 are (H, H, L).

As fuse programmable address signal FY2 is high, the address selection circuit 53 outputs column address signal AY2 as redundant column address signal FA2. As fuse programmable address signal FY3 is low, address selection circuit 54 outputs an inverted copy of column address signal AY3 as redundant column address FA3.

When column address signals AY2 and AY3 are high and low, respectively, the inputs (FMAIN, FA2, FA3) into the AND gate A50 in the address decoding circuit 55 are (H, H, H), and the output from AND gate A50 is high. When column address signal AY2 is low or column address signal AY3 is high, the three inputs of AND gate A50 are not all high so the output from AND gate A50 is low.

Therefore, when column address signal AY3 and fuse programmable address signal FY3 have the same value, and column address signal AY2 and fuse programmable address signal FY2 have the same value, the defective cell block column redundancy selection circuit 5 outputs redundant column select signals (RY0, RY1) with values (H, L) if column address signal AY1 is low, or (L, H) if column address signal AY1 is high. When the value of column address signal AY3 is not the same as the value of fuse programmable address signal FY3, or the value of column address signal AY2 is not same as the value of fuse programmable address signal FY2, the redundant column select signals (RY0, RY1) are both low (L, L).

In the adjacent cell block column redundancy selection circuit 6, the fuse in fuse-programmable circuit 57 is cut to enable the replacement of the half-block 11 located left of cell block 10. The fuse in fuse-programmable circuit 56 is left connected (the half-block 12 located to the right of cell block 10 is not replaced). Thus, the outputs (FMAINU, FMAIND) from fuse-programmable circuits 56 and 57 are (L, H).

In lower column redundancy selection circuit 75, as the inputs (DEC0, FY1D) into adjacent address generating circuit 63 are (L, L), the outputs (FYD1, DEC1) from adjacent address generating circuit 63 are (H, L). As the inputs (DEC1, FY2) into adjacent address generating circuit 64 are (L, H), the outputs (FYD2, DEC2) from adjacent address generating circuit 64 are (L, H). As the inputs (DEC2, FY3) into adjacent address generating circuit 65 are (H, L), the lower fuse programmable address signal FYD3 output from adjacent address generating circuit 65 is low. Thus, the outputs (FYD1, FYD2, FYD3) from adjacent address generating circuits 63, 64, and 65 are (H, L, L).

As lower fuse programmable address signal FYD1 is high, column address signal AY1 is output from address selection circuit 69 as lower redundant column address signal FAD1. As lower fuse programmable address signal FYD2 is low, the inverted copy of column address signal AY2 is output from address selection circuit 70 as lower redundant column address signal FAD2. As the lower fuse programmable address signal FYD3 is low, the inverted copy of column address signal AY3 is output from address selection circuit 71 as lower redundant column address signal FAD3.

When column address signals AY1, AY2, AY3 are (H, L, L), the four inputs (FMAIND, FAD1, FAD2, FAD3) into the AND gate in address decoding circuit 73 are (H, H, H, H), and the lower redundant column select signal RYD output therefrom is high. If column address signal AY1 is low, column address signal AY2 is high, or column address signal AY3 is high, the four inputs into this AND gate are not all high, and the lower redundant column select signal RYD is low.

Therefore, the lower redundant column select signal RYD output from lower column redundancy selection circuit 75 is high when the value of column address signal AY3 is the same as the value of lower fuse programmable address signal FYD3, the value of column address signal AY2 is the same as the value of lower fuse programmable address signal FYD2, and the value of column address signal AY1 is the same as the value of lower fuse programmable address signal FYD1. Otherwise, the lower redundant column select signal RYD output from lower column redundancy selection circuit 75 is low.

In upper column redundancy selection circuit 74, as the inputs (INC0, FY1U) into adjacent address generating circuit 60 are (H, H), the outputs (FYU1, INC1) from adjacent address generating circuit 61 are (L, H). As the inputs (INC1, FY2) to adjacent address generating circuit 61 are (H, H), the outputs (FYU2, INC2) from adjacent address generating circuit 64 are (L, H). As the inputs (INC2, FY3) to adjacent address generating circuit 62 are (H, L), the upper fuse programmable address signal FYU3 output from adjacent address generating circuit 62 is high. Thus, the outputs (FYU1, FYU2, FYU3) from adjacent address generating circuits 60, 61, 62 are (L, L, H).

As upper fuse programmable address signal FYU1 is low, an inverted copy of column address signal AY1 is output from address selection circuit 66 as upper redundant column address signal FAU1. As upper fuse programmable address signal FYU2 is low, an inverted copy of column address signal AY2 is output from address selection circuit 67 as upper redundant column address signal FAU2. As upper fuse programmable address signal FYU3 is high, column address signal AY3 is output from address selection circuit 68 as upper redundant column address signal FAU3.

When column address signals AY1, AY2, AY3 are (L, L, H), the corresponding inputs (FAU1, FAU2, FAU3) into the AND gate A61 in address decoding circuit 72 are (H, H, H), but the upper redundancy enable signal FMAINU is low, so the fourth input to AND gate A61 is low and the upper redundant column select signal RYU output from AND gate A61 is low. Other values of the column address signals AY1, AY2, AY3 also produce a low output from AND gate A61. Therefore, the upper redundant column select signal RYU output from upper column redundancy selection circuit 74 is always low, regardless of the value of column address signal AY3, AY2, or AY1.

Following the above redundancy repair and replacement, data from the redundant cell blocks 20, 21 are read in place of data from the defective cell block 10 and adjacent normal half-block 11.

Reading of Data from First Redundant Cell Block The operation by which redundant cell RML0 in redundant cell block 20 is read in place of defective cell ML2 in cell block 10 proceeds as follows.

When the input column address signals (AY0, AY1, AY2, AY3) are (L, L, H, L) and the input row address signals (AX1, AX2, AX3) are (H, L, L), the drain select signals (DS0, DS1) output from the cell drain selection circuit 3 are (H, L), the column select signals (Y0, Y1, Y2, Y3-Y7) output from the column decoder circuit 4 are (L, L, H, L), and the word line select signals (WL0, WL1, WL2-WL7) output from the row decoder circuit 8 are (L, H, L). The input address therefore selects defective cell ML2, but because of the redundancy repair, the redundant sense amplifier reads data from redundant cell RML0 instead, according to the following procedure.

As cell drain select signal DS0 is high, redundant cell drain select transistor RMDSL0 turns on and the cell drain voltage CDV is supplied to redundant cell drain select line RDSL0. As word line select signal WL1 is high, the memory cell transistors that have been programmed to the low threshold level in the row including cells ML0 to MR7 and redundant cells RML0 to RMR3 turn on.

In the defective cell block column redundancy selection circuit 5, column address signals (AY3, AY2, AY1) are (L, H, L), the value of column address signal AY3 being the same as the value of fuse programmable address signal FY3, and the value of column address signal AY2 being the same as the value of fuse programmable address signal FY2. Therefore, redundant column address signals (FA2, FA3) are (H, H). Since the redundancy enable signal FMAIN is also high and column address signal AY1 is low, redundant column select signal RY0 is high. The other redundant column select signal RY1 output from the defective cell block column redundancy selection circuit 5 is low.

In upper column redundancy selection circuit 74, column address signals (AY3, AY2, AY1) are (L, H, L), and the value of column address signal AY1 is the same as the value of upper fuse programmable address signal FYU1, but the value of column address signal AY3 is not the same as the value of upper fuse programmable address signal FYU3 and the value of column address signal AY2 is not the same as the value of upper fuse programmable address signal FYD2.

The upper redundant column address signals (FAU3, FAU2, FAU1) are accordingly (L, L, H), and moreover, the upper redundancy enable signal FMAINU is low. The upper redundant column select signal RYU is therefore low.

In lower column redundancy selection circuit 75, column address signals (AY3, AY2, AY1) are (L, H, L), and the value of column address signal AY3 is the same as the value of lower fuse programmable address signal FYD3, but the value of column address signal AY2 is not the same as the value of lower fuse programmable address signal FYD2, and the value of column address signal AY1 is not the same as the value of lower fuse programmable address signal FYD1. The lower redundant column address signals (FAD3, FAD2, FAD1) are accordingly (H, L, L), so the lower redundant column select signal RYD is low.

The outputs (RY0, RY1, RYU, RYD) from the defective cell block column redundancy selection circuit 5 and adjacent cell block column redundancy selection circuit 6 are accordingly (H, L, L, L). Redundant column switch transistor RMBL0 turns on while the other redundant column switch transistors RMBL1, RMBL2, RMBL3 remain off.

As noted above, the low value of column address signal AY0 activates drain select signal DS0. Thus, when address signals (AY0, AY1, AY2, AY3, AX1, AX2, AX3)=(L, L, H, L, H, L, L) for selecting defective cell ML2 are input, word line select signal WL1 is driven high, and redundant cell drain select transistor RMDSL0 and redundant column switch transistor RMBL0 turn on, selecting the redundant cell RML0 that replaces defective cell ML2. The data bit programmed into this redundant cell RML0 is output as redundant read-out data RDATA from the output terminal of the redundant cell array 2 to the redundant sense amplifier.

Data programmed into other redundant cells in the first redundant cell block 20 are similarly read in place of data in the corresponding memory cells in cell block 10.

Reading of Data from Second Redundant Cell Block (1) The operation by which redundant cell RMR3 in redundant cell block 21 is read in place of normal cell MR1 in half-block 11 proceeds as follows.

When the input column address signals (AY0, AY1, AY2, AY3) are (L, H, L, L) and the input row address signals (AX1, AX2, AX3) are (H, L, L), the drain select signals (DS0, DS1) output from the cell drain selection circuit 3 are (H, L), the column select signals (Y0, Y1, Y2-Y7) output from the column decoder circuit 4 are (L, H, L), and the word line select signals (WL0, WL1, WL2-WL7) output from the row decoder circuit 8 are (L, H, L). The input address therefore selects the cell MR1 left-adjacent to the defective cell ML2, but because of the redundancy repair, the redundant sense amplifier reads data from redundant cell RMR3 instead.

As cell drain select signal DS0 is high, redundant cell drain select transistor RMDSL4 turns on and the cell drain voltage CDV is applied to redundant cell drain select line RDSL4. As word line select signal WL1 is high, the memory cell transistors that have been programmed to the low threshold level in the row including cells ML0 to MR7 and redundant cells RML0 to RMR3 turn on.

In the defective cell block column redundancy selection circuit 5, since column address signals (AY3, AY2, AY1) are (L, L, H), the value of column address signal AY3 is the same as the value of fuse programmable address signal FY3, but the value of column address signal AY2 is not the same as the value of fuse programmable address signal FY2. Redundant column address signals FA2, FA3 are therefore (L, H), and redundant column select signals RY0, RY1 are (L, L).

In the upper column redundancy selection circuit 74, since column address signals (AY3, AY2, AY1) are (L, L, H), the value of column address signal AY2 is the same as the value of upper fuse programmable address signal FYU2, but the value of column address signal AY3 is not the same as the value of upper fuse programmable address signal FYU3, and the value of column address signal AY1 is not the same as the value of upper fuse programmable address signal FYU1. The upper redundant column address signals (FAU3, FAU2, FAU1) are accordingly (L, H, L), and moreover, the upper redundancy enable signal FMAINU is low. The upper redundant column select signal RYU is therefore low.

In the lower column redundancy selection circuit 75, since column address signals (AY3, AY2, AY1) are (L, L, H), the value of column address signal AY3 is the same as the value of lower fuse programmable address signal FYD3, the value of column address signal AY2 is the same as the value of lower fuse programmable address signal FYD2, and the value of column address signal AY1 is the same as the value of the lower fuse programmable address signal FYD1. Therefore, the lower redundant column address signals (FAD3, FAD2, FAD1) are (H, H, H). As the lower redundancy enable signal FMAIND is high, the lower redundant column select signal RYD is high.

The outputs (RY0, RY1, RYU, RYD) from the defective cell block column redundancy selection circuit 5 and adjacent cell block column redundancy selection circuit 6 are therefore (L, L, L, H). Redundant column switch transistor RMBL3 turns on while the other redundant column switch transistors RMBL0, RMBL1, RMBL2 remain off.

Thus when address signals (AY0, AY1, AY2, AY3, AX1, AX2, AX3)=(L, H, L, L, H, L, L) for selecting the normal cell MR1 left-adjacent to defective cell ML2 are input, word line select signal WL1 is driven high, and redundant cell drain select transistor RMDSL4 and redundant column switch transistor RMBL3 turn on, selecting the redundant cell RMR3 that replaces normal cell MR1. The data bit programmed into this redundant cell RMR3 is output as redundant read-out data RDATA from the output terminal of the redundant cell array 2 to the redundant sense amplifier.

Data programmed into other redundant cells in the upper half of the second redundant cell block 21 are similarly read in place of data in the corresponding memory cells in half-block 11.

Replacement of Both Adjacent Half-Blocks

If normal cell MR3 in the cell array in FIG. 2 is defective, the normal half-block 12 adjacent to the defective cell MR3 on the right side of cell block 10 is replaced with the lower of the two redundant half-blocks in redundant cell block 21. If both cells ML2 and MR3 are defective, both half-blocks 11 and 12 adjacent to the defective cell block 10 are replaced by the second redundant cell block 21 in the redundant cell array 2, each being replaced by a separate redundant half-block in the single redundant cell block 21.

When both cells ML2 and MR3 are defective, normal cell ML1 is replaced by redundant cell RML3, normal cell MR1 by redundant cell RMR3, defective cell ML2 by redundant cell RML0, normal cell MR2 by redundant cell RML0, normal cell ML3 by redundant cell RML1, defective cell MR3 by redundant cell RMR1, normal cell ML4 by redundant cell RML2, and normal cell MR4 by redundant cell RMR2. The replacement of cells in the defective cell block 10 and its left-adjacent normal half-block 11 proceeds as described above. The procedure for replacing the half-block 12 right-adjacent to cell block 10 with the lower half-block in the second redundant cell block 21 proceeds as follows.

In the adjacent cell block column redundancy selection circuit 6, in order to enable redundancy repair of the half-block 12 located to the right of cell block 10, the fuse in fuse-programmable circuit 56 is additionally cut. The two the outputs (FMAINU, FMAIND) of fuse programmable circuits 56 and 57 are now both high (H, H).

In upper column redundancy selection circuit 74, when column address signals AY1, AY2, AY3 are (L, L, H), the four inputs (FMAINU, FAU1, FAU2, FAU3) into the AND gate A61 in address decoding circuit 72 are (H, H, H, H), and the upper redundant column select signal RYU output therefrom is high. If column address signal AY1 is high, column address signal AY2 is high, or column address signal AY3 is low high, then the four inputs into AND gate A61 are not all high, and the upper redundant column select signal RYU is low.

Therefore, the upper redundant column select signal RYU output from upper column redundancy selection circuit 74 is high when the value of column address signal AY3 is the same as the value of upper fuse programmable address signal FYU3, the value of column address signal AY2 is the same as the value of upper fuse programmable address signal FYU2, and the value of column address signal AY1 is the same as the value of upper fuse programmable address signal FYU1. Otherwise, the upper redundant column select signal RYU output from upper column redundancy selection circuit 74 is low.

Reading of Data from Second Redundant Cell Block (2)

The operation by which redundant cell RML2 in redundant cell block 21 is read in place of normal cell ML4 in half-block 12 proceeds as follows.

When the input column address signals (AY0, AY1, AY2, AY3) are (L, L, L, H) and the input row address signals (AX1, AX2, AX3) are (H, L, L), the drain select signals (DS0, DS1) output from the cell drain selection circuit 3 are (H, L), the column select signals (Y0 to Y3, Y4, Y5-Y7) output from the column decoder circuit 4 are (L, H, L), and the word line select signals (WL0, WL1, WL2-WL7) output from the row decoder circuit 8 are (L, H, L). The input address signal therefore selects the cell ML4 right-adjacent to defective cell MR3 in cell block 10, but because of the redundancy repair, the redundant sense amplifier reads data from redundant cell RML2 instead.

As cell drain select signal DS0 is high, redundant cell drain select transistor RMDSL2 turns on and the cell drain voltage CDV is applied to redundant cell drain select line RDSL2. As word line select signal WL1 is high, the memory cell transistors that have been programmed to the low threshold level in the row including cells ML0 to MR7 and redundant cells RML0 to RMR3 turn on.

In the defective cell block column redundancy selection circuit 5, since column address signals (AY3, AY2, AY1) are (H, L, L), the value of column address signal AY3 is not the same as the value of fuse programmable address signal FY3, and the value of column address signal AY2 is not the same as the value of fuse programmable address signal FY2. Redundant column address signals FA2, FA3 are therefore (L, L), and redundant column select signals RY0, RY1 are (L, L).

In the upper column redundancy selection circuit 74, since column address signals (AY3, AY2, AY1) are (H, L, L), the value of column address signal AY3 is the same as the value of upper fuse programmable address signal FYU3, the value of column address signal AY2 is the same as the value of upper fuse programmable address signal FYU2, and the value of column address signal AY1 is the same as the value of upper fuse programmable address signal FYU1. Upper redundant column address signals (FAU3, FAU2, FAU1) are therefore (H, H, H). As the upper redundancy enable signal FMAINU is also high, the upper redundant column select signal RYU is high.

In the lower column redundancy selection circuit 75, since column address signals (AY3, AY2, AY1) are (H, L, L), the value of column address signal AY2 is the same as the value of lower fuse programmable address signal FYD2, the value of column address signal AY3 is not the same as the value of lower fuse programmable address signal FYD3, and the value of column address AY1 is not the same as the value of fuse programmable lower address FYD1. Lower redundant column address signals (FAD3, FAD2, FAD1) are therefore (L, H, L) and lower redundant column select signal RYD is low.

The outputs (RY0, RY1, RYU, RYD) from the defective cell block column redundancy selection circuit 5 and adjacent cell block column redundancy selection circuit 6 are therefore (L, L, H, L). Redundant column switch transistor RMBL2 turns on while the other redundant column switch transistors RMBL0, RMBL1, RMBL3 remain off.

Thus when address signals (AY0, AY1, AY2, AY3, AX1, AX2, AX3)=(L, L, L, H, H, L, L) for selecting the normal cell ML4 right-adjacent to defective cell MR4 are input, row select signal WL1 is driven high, and redundant cell drain select transistor RMDSL2 and redundant column switch transistor RMBL2 turn on, selecting the redundant cell RML2 that replaces normal cell ML4. The data bit programmed into this redundant cell RML2 is output as redundant read-out data RDATA from output terminal of redundant cell array 2 to the redundant sense amplifier.

Data programmed into other redundant cells in the lower half of the second redundant cell block 21 are similarly read in place of data in the corresponding memory cells in half-block 12.

Figure 10:
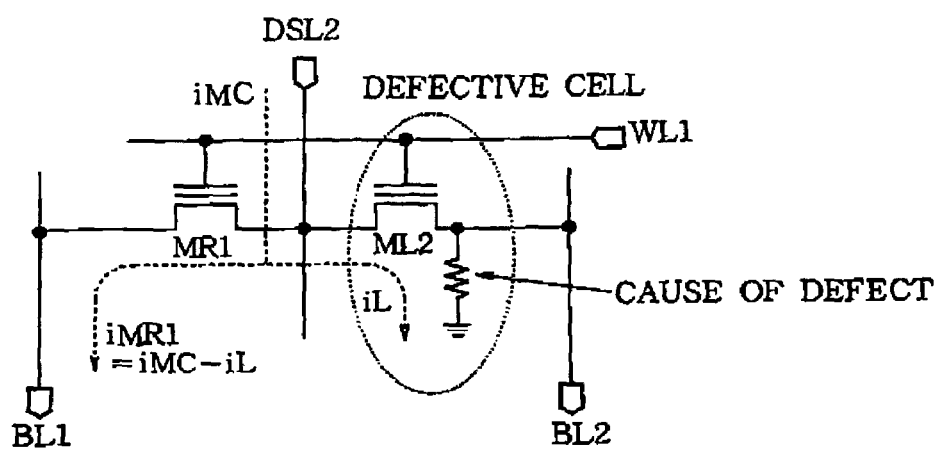
FIG. 10 is a circuit diagram illustrating a problem in the conventional PROM.

According to the embodiment described above, when a redundancy repair is performed to replace a cell block with a defective cell, the normal half-block nearest to the defective cell is also replaced with a redundant half-block. Block-wise redundancy repair can therefore be carried out without leaving non-replaced adjacent normal cells that might be affected by the defect in the manner shown in FIG. 10. Even when the defective cell is located at the edge of a cell block, the operating margin of the memory with respect to voltage and temperature variations is maintained and the problem of failure due to gradual degradation over time is mitigated without the need for a complex memory structure.

The normal cell blocks adjacent to the defective block are divided in half according to column address signal AY1. If the defect is located in the left half of the defective cell block, the upper half of the normal cell block to the left (the half-block selected when column address signal AY1 is high) is replaced. If the defect is located in the right half of the defective cell block, the lower half of the normal cell block to the right (the half-block selected when column address signal AY1 is low) is replaced. If both halves of the defective cell block include defective cells, both adjacent half-blocks are replaced simultaneously with one redundant cell block in a redundant cell array, an arrangement that avoids an undue increase in the chip size of the semiconductor memory.

The invention provides an adjacent cell block column redundancy selection circuit 6 with an upper column redundancy selection circuit 74 for generating an upper redundant column address higher by one than the address set in the fuse programmable circuits in the defective cell block column redundancy selection circuit 5, and a lower column redundancy selection circuit 75 for generating a lower redundant column address lower by one than the address set in the fuse programmable circuits in the defective cell block column redundancy selection circuit 5. This is the structure that makes it possible to select a redundant half-block to replace a half-block adjacent to the defective cell.

In the embodiment above, the normal cell array is divided into cell blocks with two bit lines apiece, but the cell blocks may include a larger number of bit lines apiece. In this case, when there is a defective memory cell at or near an edge of a cell block, the adjacent normal half-block may be replaced, or only the adjacent bit line may be replaced, if that provides adequate isolation of the defect.

More generally, if the defective cell block is selected by n address bits, then the replaced normal fractional block may selected by m address bits, where m and n are arbitrary integers such that m is greater than n. Equivalently, the first redundant cell block is selected by n address bits and the second (fractional) redundant cell block is selected by m address bits.

In the embodiment described above, the invention is applied to a column redundancy scheme, but the invention is also applicable to row redundancy schemes.

The invention is not limited to a programmable read-only memory; it can also be applied to other types of semiconductor memory, such as dynamic random-access memory (DRAM) and static random-access memory (SRAM).

Those skilled in the art will recognize that further variations are possible within the scope of the invention, which is defined in the appended claims.

What is claimed is:

1. A semiconductor memory, comprising:
   a defective cell block;
   a normal cell block adjacent to the defective cell block;
   a first redundant cell block;
   a second redundant cell block, each of the first redundant cell block, the second redundant cell block, the defective cell block, and the normal cell block including a separate plurality of memory cells organized into a plurality of rows and a plurality of columns, all of the memory cells in the defective cell block being replaced by memory cells in the first redundant cell block, at least some of the memory cells in the normal cell block being replaced by memory cells in the second redundant cell block;
   a programmable circuit for storing a complete address of the defective cell block;
   a first address generator for generating, from the stored address of the defective cell block and an input address signal selecting the defective cell block, a first redundant address signal selecting the first redundant cell block;
   a second address generator for generating, from the stored address of the defective cell block and an input address signal selecting the normal cell block adjacent to the defective cell block, a second redundant address signal selecting the second redundant cell block; and
   a decoding circuit for decoding the first and second redundant address signals to generate signals selecting memory cells in the first and second redundant cell blocks, wherein the second address generator comprises:
an incrementer for incrementing the address of the defective cell block; and
an upper selection circuit for comparing bits of the incremented address of the defective cell block with corresponding bits of the input address signal to generate an upper comparison output;
an upper fuse-programmable circuit for generating an upper enable signal; and
the decoding circuit combines the upper enable signal with the upper comparison output.

2. A semiconductor memory, comprising:
a defective cell block;
a normal cell block adjacent to the defective cell block;
a first redundant cell block;
a second redundant cell block, each of the first redundant cell block, the second redundant cell block, the defective cell block, and the normal cell block including a separate plurality of memory cells organized into a plurality of rows and a plurality of columns, all of the memory cells in the defective cell block being replaced by memory cells in the first redundant cell block, at least some of the memory cells in the normal cell block being replaced by memory cells in the second redundant cell block;
a programmable circuit for storing a complete address of the defective cell block;
a first address generator for generating, from the stored address of the defective cell block and an input address signal selecting the defective cell block, a first redundant address signal selecting the first redundant cell block;
a second address generator for generating, from the stored address of the defective cell block and an input address signal selecting the normal cell block adjacent to the defective cell block, a second redundant address signal selecting the second redundant cell block; and
a decoding circuit for decoding the first and second redundant address signals to generate signals selecting memory cells in the first and second redundant cell blocks, wherein
the second address generator comprises:
a decrementer for decrementing the address of the defective cell block; and
a lower selection circuit for comparing bits of the decremented address of the defective cell block with corresponding bits of the input address signal to generate a lower comparison output;
a lower fuse-programmable circuit for generating a lower enable signal; and
the decoding circuit combines the lower enable signal with the lower comparison output.

3. A semiconductor memory, comprising:
a defective cell block;
a normal cell block adjacent to the defective cell block;
a first redundant cell block;
a second redundant cell block, each of the first redundant cell block, the second redundant cell block, the defective cell block, and the normal cell block including a separate plurality of memory cells organized into a plurality of rows and a plurality of columns, all of the memory cells in the defective cell block being replaced by memory cells in the first redundant cell block, at least some of the memory cells in the normal cell block being replaced by memory cells in the second redundant cell block;
a programmable circuit for storing a complete address of the defective cell block;
a first address generator for generating, from the stored address of the defective cell block and an input address signal selecting the defective cell block, a first redundant address signal selecting the first redundant cell block;
a second address generator for generating, from the stored address of the defective cell block and an input address signal selecting the normal cell block adjacent to the defective cell block, a second redundant address signal selecting the second redundant cell block; and
a decoding circuit for decoding the first and second redundant address signals to generate signals selecting memory cells in the first and second redundant cell blocks, wherein the normal cell block adjacent to the defective cell block comprises an upper half-block adjacent to one side of the defective cell block and a lower half-block adjacent to another side of the defective cell block, the semiconductor memory further comprising:
a programmable circuit for storing an address of the defective cell block;
a first address generator for generating, from the stored address of the defective cell block and an input address signal selecting the defective cell block, a first redundant address signal selecting the first redundant cell block;
a second address generator for generating, from the stored address of the defective cell block and an input address signal selecting the upper half-block, a second redundant address signal selecting one half of the second redundant cell block;
a third address generator for generating, from the stored address of the defective cell block and an input address signal selecting the lower half-block, a third redundant address signal selecting another half of the second redundant cell block; and
a decoding circuit for decoding the first, second, and third redundant address signals to generate signals selecting redundant memory cells in the first and second redundant cell blocks, wherein
the second address generator comprises
an incrementer for incrementing the address of the defective cell block and appending a '0' bit to the incremented address to generate an upper address, and
an upper selection circuit for comparing bits of the upper address with corresponding bits of the input address signal to generate an upper comparison output;
and the third address generator comprises
a decrementer for decrementing the address of the defective cell block and appending a '1' bit to the decremented address to generate a lower address, and
a lower selection circuit for comparing bits of the lower address with corresponding bits of the input address signal to generate a lower comparison output.

4. The semiconductor memory of claim 3, wherein:
the second address generator further comprises an upper fuse-programmable circuit for generating an upper enable signal;
the third address generator further comprises a lower fuse-programmable circuit for generating a lower enable signal; and in generating signals selecting redundant memory cells in the second redundant cell block, the decoding circuit also decodes the upper enable signal and the lower enable signal.

5. A semiconductor memory, comprising:
a defective cell block;
a normal cell block adjacent to the defective cell block;
a first redundant cell block;
a second redundant cell block, each of the first redundant cell block, the second redundant cell block, the defective cell block, and the normal cell block including a separate plurality of memory cells organized into a plurality of rows and a plurality of columns, all of the memory cells in the defective cell block being replaced by memory cells in the first redundant cell block, at least some of the memory cells in the normal cell block being replaced by memory cells in the second redundant cell block;
a programmable circuit for storing a complete address of the defective cell block;
a first address generator for generating, from the stored address of the defective cell block and an input address signal selecting the defective cell block, a first redundant address signal selecting the first redundant cell block;
a second address generator for generating, from the stored address of the defective cell block and an input address signal selecting the normal cell block adjacent to the defective cell block, a second redundant address signal selecting the second redundant cell block; and
a decoding circuit for decoding the first and second redundant address signals to generate signals selecting memory cells in the first and second redundant cell blocks, wherein
the second redundant cell block is selected by m address bits and the first redundant cell block is selected by an n-bit subset of the m address bits, m and n being positive integers such that m is greater than n.

6. The semiconductor memory of claim 5, further comprising:
a programmable circuit for storing an address of the defective cell block;
a first logic circuit for comparing the address of the defective cell block with corresponding bits of an input address signal to generate a first signal for selecting memory cells in the first redundant cell block;
an incrementer for incrementing the address of the defective cell block and appending (m−n) '0' bits to the resulting incremented address;
a second logic circuit for comparing the incremented address and the appended '0' bits with corresponding bits of the input address signal to generate a second signal for selecting memory cells in one part of the second redundant cell block;
a decrementer for decrementing the address of the defective cell block and appending (m−n) '1' bits to the resulting decremented address; and
a third logic circuit for comparing the decremented address and the appended '1' bits with corresponding bits of the input address signal to generate a third signal for selecting memory cells in another part of the second redundant cell block.

7. The semiconductor memory of claim 5, wherein m is greater than n by one.

8. The semiconductor memory of claim 6, wherein:
the memory cells in said one part of the second redundant cell block are directly connected to a single signal line; and
the memory cells in said another part of the second redundant cell block are directly connected to another single signal line.

9. A method of selecting a memory cell in a semiconductor memory having a defective cell block, a normal cell block adjacent to the defective cell block, a first redundant cell block, and a second redundant cell block, the defective cell block, the normal cell block, the first redundant cell block, and the second redundant cell block each including a separate plurality of memory cells organized into a plurality of rows and a plurality of columns, the method comprising:
storing a complete address of the defective cell block;
generating, from the stored address of the defective cell block and an input address signal selecting the defective cell block, a first redundant address signal selecting the first redundant cell block, all of the memory cells in the defective cell block thereby being replaced by memory cells in the first redundant cell block; and
generating, from the stored address of the defective cell block and an input address signal selecting a the normal cell block, a second redundant address signal selecting the second redundant cell block, at least some of the memory cells in the normal cell block thereby being replaced by memory cells in the second redundant block, wherein
the second redundant cell block is selected by m address bits and the first redundant cell block is selected by an n-bit subset of the m address bits, m and n being positive integers such that m is greater than n.

10. The method of claim 9, wherein m is greater than n by one.

11. The method of claim 9, wherein generating the second redundant address signal further comprises:
incrementing the stored address of the defective cell block to generate an incremented address;
appending (m−n) '0' bits to the incremented address; and
comparing the incremented address and appended '0' bits with the input address signal.

12. The method of claim 9, wherein generating the second redundant address signal further comprises:
decrementing the stored address of the defective cell block to generate a decremented address;
appending (m−n) '1' bits to the decremented address; and
comparing the decremented address and appended '1' bits with the input address signal.

* * * * *